United States Patent
Tseng

(10) Patent No.: US 8,611,080 B2
(45) Date of Patent: Dec. 17, 2013

(54) SERVER SYSTEM

(75) Inventor: I-Hsiu Tseng, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 200 days.

(21) Appl. No.: 13/067,322

(22) Filed: May 25, 2011

(65) Prior Publication Data

US 2011/0292587 A1    Dec. 1, 2011

(30) Foreign Application Priority Data

May 31, 2010   (TW) ............................... 99117455 A

(51) Int. Cl.
*G06F 1/16* (2006.01)
*H05K 7/20* (2006.01)

(52) U.S. Cl.
USPC ..................................... 361/679.31; 361/695

(58) Field of Classification Search
USPC .................................................... 361/679.31
See application file for complete search history.

(56) References Cited

U.S. PATENT DOCUMENTS

| | | | |
|---|---|---|---|
| 6,008,538 A * | 12/1999 | Akram et al. ................. | 257/723 |
| 6,011,689 A * | 1/2000 | Wrycraft ....................... | 361/695 |
| 7,892,626 B2 * | 2/2011 | Abe et al. .................... | 428/195.1 |
| 8,207,693 B2 * | 6/2012 | Hauser et al. ................. | 318/34 |
| 2002/0196601 A1 * | 12/2002 | Lee et al. ...................... | 361/685 |
| 2005/0147117 A1 * | 7/2005 | Pettey et al. .................. | 370/463 |
| 2010/0202119 A1 * | 8/2010 | Nagami et al. ............... | 361/749 |
| 2010/0264733 A1 * | 10/2010 | Arimilli et al. ................ | 307/31 |

FOREIGN PATENT DOCUMENTS

| | | |
|---|---|---|
| CN | 1412677 A | 4/2003 |
| CN | 101169680 A | 4/2008 |
| TW | M367570 U1 | 10/2009 |
| TW | 2009 47221 A | 11/2009 |

OTHER PUBLICATIONS

Office action of corresponding CN application No. 201010192453.0 and English translation of p. 3-4 as marked in the office action.
Office Action dated Aug. 29, 2013 issued in corresponding Taiwan application No. 099117455.

* cited by examiner

*Primary Examiner* — Gregory Thompson
(74) *Attorney, Agent, or Firm* — Bacon & Thomas, PLLC

(57) ABSTRACT

A server system includes at least one motherboard, a control board, and a power module. The control board is connected electronically to each motherboard. The control board includes an I/O module for connecting at least one external device and a switching module for switching each motherboard to connect electronically to the at least one external device. The power module is connected electronically to the control board. The power module may supply power to each motherboard through the control board, and the power supplied to each motherboard is switched by the switching module.

8 Claims, 2 Drawing Sheets

SERVER SYSTEM

BACKGROUND OF THE INVENTION

1. Field of the Invention

The present invention relates to a server system and, more particularly, to a server system which can be reduced the use of connecting lines and managed each server unit easily.

2. Description of the Related Art

A server can provide faster data calculating ability for storing or processing a lot of data. When a user has a request to use a plurality of typical servers, he or she must spare enough space to dispose the servers and other related devices because the typical server usually has bigger physical volume. It is difficult to furnish the servers regularly because different server may have different size of case. Therefore, a rack mount server with a standardized size of the case is manufactured. The physical volume of the rack mount server can be reduced, and the user can furnish regularly the plurality of rack mount servers with the same size.

However, for a small size server, such as a rack mount server with 1U standard (1U represents that the height of the server case is 4.45 cm), only one or two computer unit can be disposed in the case due to the inner space limitations of the server. When the user wants to increase number of the computer unit to must dispose new rack mount server with 1U standard or replace bigger server with other standard to cause additional costs in the server. Furthermore, each element in the server is usually connected to another element by a bus or a connecting line for transmitting signals or power. When the number of the computer unit disposed in the same server is increases, more buses or connecting lines may be used. The complicated disposition of the buses or the connecting lines may occupy inner space of the server and reduce cooling effect in the server. If one element of the computer unit is breakdown, it is difficult to replace the element due to the buses or the connecting lines.

SUMMARY OF THE INVENTION

It is an object of the present invention to provide a server system which can be reduced the use of connecting lines and managed each server unit easily.

In order to achieve the above object, a server system of the present invention comprises at least one motherboard, a control board, and a power module. Each motherboard comprises at least one processing unit and at least one memory unit. The control board is connected electronically to each motherboard. The control board comprises an I/O module for connecting at least one external device and a switching module for switching each motherboard to connect electronically to the at least one external device. The power module is connected electronically to the control board. The power module supplies power to each motherboard through the control board, and the power supplied by the power module to each motherboard is switched via the switching module. Therefore, a user can switch and supply power easily to each server unit of the server system of the present invention. The signals and power are transmitted by the control board to reduce the use of connecting lines in the present invention.

In one embodiment of the present invention, the server system comprises at least one motherboard, a control board, and a power module. Each motherboard comprises at least one processing unit and at least one memory unit. The control board is connected electronically to each motherboard. The control board comprises a main portion, an extending portion, and a switching module. The main portion is substantially vertical to the extending portion. The main portion comprises an I/O module for connecting to at least one external device. The extending portion comprises at least one slot for inserting the motherboard to make the motherboard connect electrically to the switching module. The switching module is used for switching electronic connection between each motherboard and the at least one external device. The power module is connected electronically to the control board. The power module supplies power to each motherboard through the control board, and the power supplied by the power module to each motherboard is switched via the switching module.

DETAILED DESCRIPTION OF THE PREFERRED EMBODIMENT

The advantages and innovative features of the invention will become more apparent from the following detailed description when taken in conjunction with the accompanying drawings.

Figure 1:
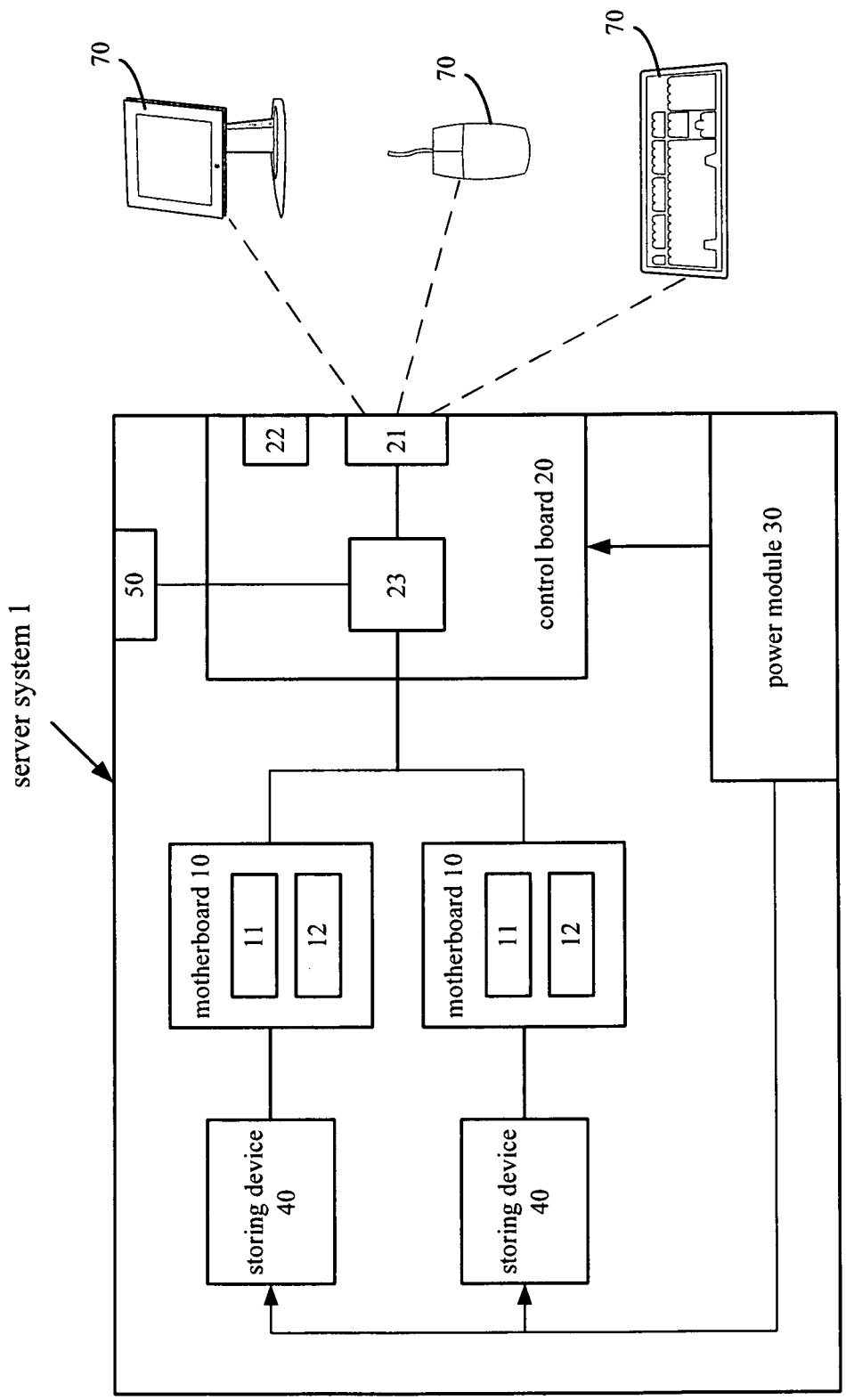
FIG. 1 is a schematic view showing a server system of the present invention.

Please refer to FIG. 1 for a schematic view showing a server system 1 of the present invention. As shown in FIG. 1, a server system 1 of the present invention comprises at least one motherboard 10, a control board 20, a power module 30, and at least one storing device 40. Each motherboard 10 is connected electrically to a control board and the corresponding storing device 40 respectively. Each motherboard 10 comprises at least one processing unit 11 and at least one memory unit 12. The processing unit 11 can process commands or signals received by the motherboard 10, such as a CPU. The memory unit 12 is used for storing any kind of program or command to execute by processing unit 11, such as a memory.

The control board 20 comprises an I/O module 21 and a switching module 23. The control board 20 is connected electrically to at least one external device 70 by the I/O module 21. The I/O module 21 comprises a plurality of connecting interfaces with the same or different types, such as at least one of at least one image output interface and at least one PS/2 interface. The control board 20 further comprises a GPIO module 22, and the GPIO module 22 comprises at least one LAN interface, at least one USB interface, and other data transmitting interfaces. The at least one external device 70 connected to the I/O module 21 may be a display screen (corresponding to the image output interface), a keyboard device (corresponding to the PS/2 interface), or a mouse device (corresponding to the PS/2 interface). The switching module 23 is connected electrically to each motherboard 10 and the I/O module 21 respectively. The switching module 23 is used for switching the electrical connection between each motherboard 10 and the at least one external device 70. Therefore, each motherboard 10 may transmit at least one of data, a control command, a LAN signal, or an image signal via the control board 20. In this embodiment, the switching module 23 is an element with KVM switch function for switching a keyboard, a mouse, and a display screen to support different server unit.

The power module 30 is connected electrically to the control board 20 and each storing device 40 for supplying power, and the power module 30 can supply power to each motherboard 10 through the control board 20. The switching module 23 of the control board 20 also has the function to select the target to supply power by the power module 30. The switching module 23 of the control board 20 can also switch the supply power provided by the power module 30 to supply to any motherboard 10.

Each motherboard 10 and each storing device 40 disposed correspondingly to each motherboard 10 can form a server unit, and each storing device 40 is connected electrically to the corresponding motherboard 10 to provide stored data or program for executing by the processing unit 11 of the motherboard 10. Therefore, the server system 1 of the present invention may comprise one or more server units according to different requests of the user.

According to the design of the server system 1 of the present invention, any signal is transmitted between any motherboard 10 and each external device 70 through the control board 20, and the power module 30 supplies power to each motherboard 10 through the control board 20. The switching module 23 of the control board 20 can control each external device 70 to connect electrically to any motherboard 10 for transmitting signals and the power module 30 to select the motherboard 10 for supplying power. Then, the server system 1 of the present invention can control and switch any server unit effectively.

Figure 2:
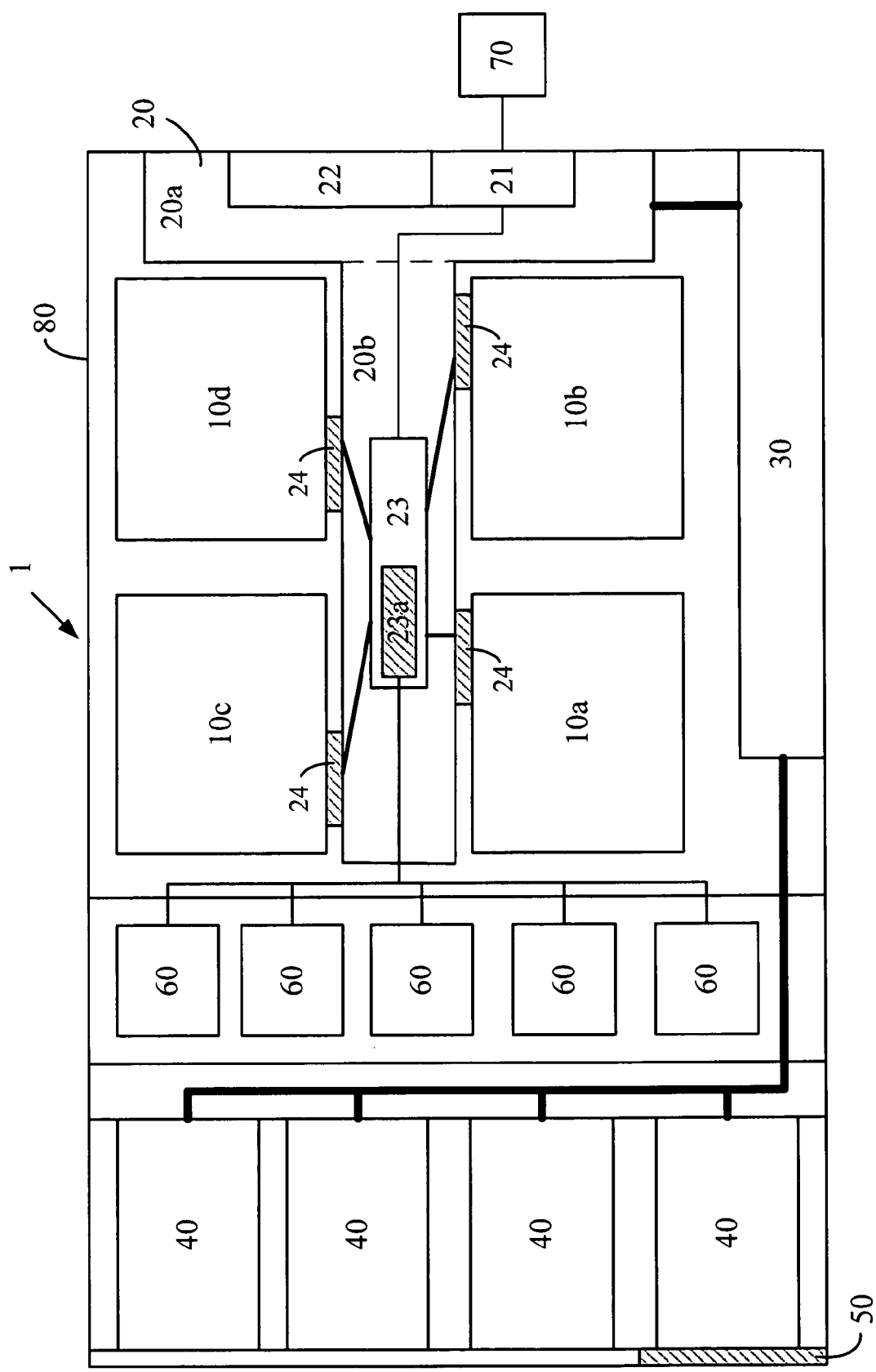
FIG. 2 is a structural view showing an embodiment of the server system of the present invention.

Please refer to FIG. 2 for a structural view showing an embodiment of the server system of the present invention. As shown in FIG. 2, for one embodiment of the server system 1 of the present invention, the server system 1 further comprises a case 80 with 1U standard of the rack-mount server. There are four server units disposed in the case 80. The server system 1 of the present invention is described distinctly according to the above embodiment; however, the present invention is not limited thereto.

As shown in FIG. 2, in this embodiment, the control board 20 of the server system 1 of the present invention further comprises a main portion 20a and an extending portion 20b. The main portion 20a is substantially vertical to the extending portion 20b to form a T-shaped structure. The main portion 20a is disposed near the case 80, and the I/O module 21 is disposed on the main portion 20a so that the external device 70 can connect to the I/O module 21 through predisposed opening (not shown) of the case 80. The extending portion 20b has four slots 24 for the motherboards 10a, 10b, 10c, 10d to insert correspondingly to form electronic connection between the switch module 23 and each motherboard 10a, 10b, 10c, 10d. Each motherboard 10a, 10b, 10c, 10d inserted on the slot 24 is keep on a same plane substantially parallel with the extending portion 20b, and the motherboards 10a, 10b, 10c, 10d are disposed around the control board 20 to reduce the useable space in the case 80. Through the slots 24, any signals and supply power can be transmitted from the control board 20 to the motherboard 10a, 10b, 10c, 10d, and any signals generated from the motherboard 10a, 10b, 10c, 10d also can be transmitted to the control board 20.

The switch module 23 is connected electrically to the motherboards 10a, 10b, 10c, 10d, the I/O module 21, and the power module 30 respectively. The switching module 23 provides the switching functions for supplying power to the corresponding motherboard 10a, 10b, 10c, 10d and determining the electrical connection between each motherboard 10a, 10b, 10c, 10d and the at least one external device 70. By controlling the switching module 23, the power module 30 can be notified to supply power to one or more motherboards, and the at least one external device 70 can be connected electrically to any motherboards 10a, 10b, 10c, 10d for transmitting signals (e.g. display image signals for displaying, inputted commands from the keyboard device or the mouse device or the like). It is convenient for switching to execute any server unit in the server system 1 of the present invention. In this embodiment, the switching module 23 is disposed on the extending portion 20b, but it can be disposed on the main portion 20a for different designs; however, the present invention is not limited thereto.

As shown in FIG. 1 and FIG. 2, for executing the switching functions conveniently, the server system 1 of the present invention further comprises a switch set 50. The switch set 50 is disposed on a front board of the case 80 and is connected electrically to the switching module 23. The switch set 50 comprises a plurality of individual power switches and signal switches. The user can control the power module 30 to determine supply power to any motherboard 10a, 10b, 10c, 10d by the power switches respectively. The user can also determine whether any motherboard 10a, 10b, 10c, 10d is connected to the external device 70 for transmitting signals by the signal switches respectively.

Accordingly, the signals transmitted between each motherboard 10a, 10b, 10c, 10d and the external device 70 and the power supplied by the power module 30 are controlled through the control board 20. It can reduce the use of the connecting lines to increase inner space and cooling effect in the case 80 of the server system 1.

Furthermore, the server system 1 of the present invention further comprises a plurality of fans 60 for advancing correspondingly cooling effect of the processing unit of each motherboard 10a, 10b, 10c, 10d and the inner space of the case 80. Each fan 60 can comprise a guiding channel (not shown) extended to the processing unit of the motherboard for cooling. The switching module 23 comprises a fan controlling unit 23a for adjusting speed of each fan 60 to avoid overheating of the motherboard. The fan controlling unit 23a monitors heat generated by each motherboard 10a, 10b, 10c, 10d to adjust speed of each fan 60 corresponding to each motherboard 10a, 10b, 10c, 10d.

According to the above-mentioned designs of the present invention, the inner space of the case 80 with 1U standard can be used effectively, and the control board can be a transmitting medium for signals and power to avoid the complicated disposition of the connecting lines. Furthermore, it is convenient to switch any server unit of the server system for using.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A server system for disposing at least one server unit, the server system comprising:

at least one motherboard, each of the at least one motherboard comprising at least one processing unit and at least one memory unit;

a control board connecting electrically to each of the at least one motherboard, the control board comprising a main portion, an extending portion, and a switching module, wherein the main portion is substantially vertical to the extending portion, the main portion comprises an I/O module for connecting to at least one external device; the extending portion comprises at least one slot for inserting the at least one motherboard to make the at least one motherboard connect electrically to the switching module; the switching module is used for switching electronic connection between each of the at least one motherboard and the at least one external device; and a power module connecting electrically to the control board, wherein the power module supplies power to each of the at least one motherboard via the control board, and the power supplied by the power module to each of the at least one motherboard is switched via the switching module.

2. The server system as claimed in claim 1, wherein the at least one motherboard inserted into the at least one slot keeps on a same plane substantially parallel with the extending part portion.

3. The server system as claimed in claim 1, further comprises a switch set connecting electrically to the switch module, wherein the switch set controls whether or not to supply power to each of the at least one motherboard, or controls whether or not to electrically connect each of the at least one motherboard to the at least one external device.

4. The server system as claimed in claim 1, wherein the I/O module comprises at least one of at least one video signal output interface and at least one PS/2 interface.

5. The server system as claimed in claim 1, wherein each motherboard transmits signals by the controlling board, and the signals comprises at least one of a data signal, a control command signal, a LAN signal, and an image signal.

6. The server system as claimed in claim 1, further comprises a plurality of fans for advancing correspondingly cooling effect of the processing unit of each of the at least one motherboard, wherein the switching module comprises a fan controlling unit for adjusting speed of each fan.

7. The server system as claimed in claim 6, wherein the fan controlling unit monitors heat generated by each of the at least one motherboard to adjust speed of each fan of the plurality of fans corresponding to each motherboard.

8. The server system as claimed in claim 1, further comprises a case with a standard corresponding to a 1U rack mount server.

* * * * *